United States Patent [19]

Sakai et al.

[11] Patent Number: 4,835,083
[45] Date of Patent: May 30, 1989

[54] METHOD FOR PATTERNING ELECTROCONDUCTIVE FILM AND PATTERNED ELECTROCONDUCTIVE FILM

[75] Inventors: Kunihiro Sakai, Yamato; Kenji Saitoh, Yokohama; Toshihiko Miyazaki; Ken Eguchi, both of Atsugi; Haruki Kawada, Atsugi; Toshiaki Kimura, Sagamihara; Kiyoshi Takimoto, Atsugi; Hiroshi Matsuda, Atsugi; Yukuo Nishimura, Sagamihara; Yoshinori Tomida, Atsugi, all of Japan

[73] Assignee: Canon Kabushiki Kaisha, Tokyo, Japan

[21] Appl. No.: 38,722

[22] Filed: Apr. 15, 1987

[30] Foreign Application Priority Data

Apr. 16, 1986 [JP] Japan .................................. 61-86151
Apr. 18, 1986 [JP] Japan .................................. 61-88151
May 12, 1986 [JP] Japan .................................. 61-106572
May 28, 1986 [JP] Japan .................................. 61-121297

[51] Int. Cl.$^4$ .............................................. G03G 5/04
[52] U.S. Cl. .................................... 430/130; 430/227; 430/272; 430/296

[58] Field of Search ............... 430/296, 227, 272, 130; 427/66; 428/917

[56] References Cited

U.S. PATENT DOCUMENTS 4,672,265  6/1987  Eguchi et al. ...................... 427/66
4,725,513  2/1988  Eguchi et al. ...................... 428/917

*Primary Examiner*—John L. Goodrow
*Attorney, Agent, or Firm*—Fitzpatrick, Cella, Harper & Scinto

[57] ABSTRACT

An electroconductive film is provided which has a first region constituted of a lamination layer comprising an electroconductive layer and an insulating layer, and a second layer having reduced or eliminated electroconductivity. Another type of electroconductive film is also provided having a first region constituted of a limination layer containing a compound having a polymerizable double bond and comprising an electroconductive layer and an insulating layer, and a second layer which is modified and having changed dissolution characteristics. The layer may be formed of a monomolecular film or monomolecular built-up film. A patterning method by use of the above electroconductive film is also provided.

19 Claims, 8 Drawing Sheets

METHOD FOR PATTERNING ELECTROCONDUCTIVE FILM AND PATTERNED ELECTROCONDUCTIVE FILM

BACKGROUND OF THE INVENTION

1. Field of the Invention

This invention relates to manipulations of (i.e. a patterning technique for) electroconductive film comprising a monomolecular film or monomolecular built-up film and to said electroconductive film having been patterned. More particularly, the present invention relates to a method for manipulation an electroconductive film to change its electrical characteristics in accordance with a desired pattern and also to the electroconductive film prepared by such manipulation. The present invention also relates to a method for providing an electrode on an electroconductive film, particularly a method for providing an electrode at the terminal ends of an electroconductive film having a constitution with electroconductive layers and insulating layers being laminated alternately. The present invention further relates to a method for providing an electrode, particularly a method for providing an electrode by forming a peeled portion on an electroconductive film such as monomolecular film or monomolecular built-up film, etc., provided on a support by exposure to energy irradiation and providing an electrode at said peeled portion. Further, the present invention relates to a method for manipulating (or patterning) by polymerization of a specific compound in an electroconductive film of a monomolecular film or monomolecular built-up film.

2. Description of Related Art

Generally, a molecule having a hydrophilic group and a hydrophobic group therein with an adequate balance between the both groups (amphiphilic balance) forms a monomolecular layer with the hydrophilic group directed toward on the water surface When the planar density of this monomolecular layer is increased, the intermolecular interaction is intensified to give a two dimensional "condensed film (or a solid film)". The condensed film can be transferred as a monomolecular film onto the surface of a substrate such as glass, and by repeating this operation multiple times onto the same substrate, a monomolecular built-up film can be formed on the substrate. The method for preparing such monomolecular film or its built-up film is known as the Langmuir-Blodgett method (hereinafter referred to as LB method) and is described in detail, for example, in Sin-jikken Kagaku Koza (New Course of Experimental Chemistry) 18 Surface and Colloid" pp. 498–507, published by Maruzen It is also known that certain organic molecules can be formed into a monomolecular film or its built-up film according to the LB method or the like to give an electroconductive thin film. Alternatively organic molecules in monomolecular film or its built-up film can be polymerized to give an electroconductive polymer film Further, it has been recently reported that an amphiphilic charge transfer complex having a long alkyl group as the hydrophobic site such as bis-tetracyanoquinodimethane docosylpyridinium:

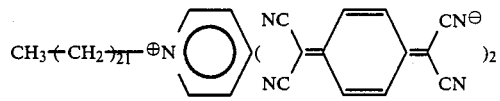

which is an organic compound with tetracyanoquinodimethane (TCQN) being as the electron acceptor can be formed into a monomolecular built-up film according to the LB method (Preprint of the 51th Autumn Annual Meeting of Chemical Society of Japan, p. 490). This monomolecular built-up film was observed to have an electroconductivity as high as 0.1 S/cm in the direction parallel to the $10^{-14}$ S/cm in the direction perpendicular thereto, thus behaving as an insulator in that direction.

When an organic thin film is prepared according to the LB method employing such molecules the electron cloud of the charge transfer complex constituting the hydrophilic site in the condensed film state will be greater, whereby electroconductivity is exhibited in the direction in parallel to the film surface. At the same time the long chain alkyl group constituting the hydrophobic site forms an insulator portion. Accordingly, the built-up film thus formed on a substrate is characterized by electroconductive layers and insulating layers laminated alternately.

When the film structure is, analyzed electrically for example, as shown in FIG. 11, the electroconductive regions 14 due to the hydrophilic site and the insulating regions 13 due to the hydrophobic site are repeated alternately in the built-up direction (the direction perpendicular to the film surface of monomolecular built-up film 20 on the substrate 12). This electroconductive monomolecular built-up film is noteworthy from the viewpoint of its application for electronic devices or in the development of molecular electronics, or to bioelectronics as a ultra-thin film electroconductor exhibiting great anisotropy in electroconductivity.

In the application of such organic electroconductive materials to wiring materials, or as electronic device materials, a technique is essential for manipulating the electroconductive thin film to form an electroconductive region with any desired shape (patterning technique).

Patterning techniques of the prior art can be roughly classified into two categories of methods, one being the method to effect selective growth of film only in the desired region, and the other being the method in which a pattern is formed by a post-treatment after film formation.

Although the LB method of forming a monomolecular film provides means for easily forming an extremely uniform film with respect to the film surface direction on the substrate having the monomolecular layer transferred thereon, it is very difficult to selectively grow the monomolecular built-up film on such a substrate. It is for this technical reason that practical application of the LB method is limited in spite of a large number of investigations. Accordingly, post-treatment is advantageous in pattern formation of a monomolecular built-up film. Methods for changing electrical characteristics of the film by post-treatment of monomolecular built-up film, are known. For example an iodine-doping method (Mol. Cryst. Liq. Cryst., 120 (1985) 319) is known electroconductivity is increased.

A change in electroconductivity is also reported to occur together with a change in light absorption characteristics of a dye film by acid or alkali treatment (Thin Solid Films, 129 (1985) 15).

However, all of these methods relate to post-treatments of the entire film, and they are not intended for application to electronic device materials as mentioned above.

Of course, if a desired region of a monomolecular built-up film could be removed from the substrate, a desired electroconductive pattern would be formed, and there would be possibility to realize this according to the chemical etching method which has been used in a variety of technical fields, typically in inorganic semiconductors. However, a masking material, a masking method, and an etchant (an etching solution) cannot easily be selected, and also the selection depends greatly on the kind of the molecule constituting the film and therefore there is no generally applicable way. In addition, such method is not suitable for fine working, and uniform working on a large area cannot easily be done, and therefore it is limited in uses as the working technique.

On the other hand, various methods have been known for preparing print wiring, but in the case of preparing fine wiring on a metal thin film such as of copper, aluminum, etc., the problem arises in the point of necessity of large number of steps of (1) vapor deposition of metal on the substrate, (2) coating of photoresist, (3) exposure to light, (4) developing, (5) etching, (6) removal of resist. Wiring members for bioelectronics could not be prepared by such a method, because substrate shall be heated on vapor deposition of a metal.

On the other hand, for providing an electrode onto an electroconductive film, there have been known, for example, the following methods: [1] a method in which an electrode pattern is provided previously on the substrate for lamination of an electroconductive film thereon and then an electroconductive film layer is formed thereon; [2] a method in which an electrode pattern is directly formed on an electroconductive film; [3] a method in which a probe is contacted with electroconductive film, or an electrode in a blade shape is pressure contacted with the film; and [4] a method in which an electroconductive paste is coated on the electroconductive film.

In the electroconductive film formed of a monomolecular built-up film having electroconductive layers and insulating layers laminated alternately, conductivity in the direction of the normal line of the film surface is extremely low, and current can flow through only one layer of the electroconductive layer exposed on the film surface according to the above methods [1] and [2], whereby other electroconductive layers could not be utilized as current passages. With the methods of [3] and [4], all of the electroconductive layers can be utilized as current passages, but mechanical breaking of the film or chemical breaking of film with solvents, etc., are sometimes caused. Further, since the terminal ends of the respective electroconductive layers in contact with electrodes are formed thinly, they cannot sufficiently contact the electrodes, and in some cases incomplete conduction occurred due to failure of contact of a part of electroconductive layers with electrodes.

Also, as a method (5), in conventional bulk or inorganic thin films, as shown in FIG. 12, said thin film 21 is provided on the substrate 12 and electrodes (metal layer such as Au, Cu, Al, etc.) 10 are provided on (see FIG. 12A) or beneath (see FIG. 12A) the surface of said thin film 21, whereby electrode formation such as ohmic or Schottky junction etc., can be effected. However, when the above method [5] is applied to the organic thin film having electrical anisotropy as described above, due to the presence of insulating layer between each electroconductive region and electrode, it is difficult to form electrodes such as ohmic or Schottky junction, etc.

Very few methods for providing electrode onto organic materials having such electrical anisotropy can be found in the prior art, and also they have been poor in controllability of electrode shape, etc. For example, in the case of measurement of conductivity in the planar direction of a monomolecular built-up film comprising bis-tetracyanoquinodimethane docosylpyridinium as mentioned above, a part of the monomolecular built-up film 20 built up on the glass substrate 12 as shown in FIG. 13 is mechanically destroyed or peeled off, and a conductor is filled at the site to provide thereby external connecting electrodes 22 for said built-up film. Specifically, it is applied by rubbing an electroconductive paint (e.g. silver paste, etc.) against said monomolecular built-up film, and the state electrodes provided is as shown in FIG. 13.

However, according to the method for equipment of electrodes as described above, the electrode portion is not necessarily regular but rather uneven as shown in FIG. 13, whereby it is difficult to control precisely parameters influencing greatly the electrical characteristic such as inter-electrode distance or electrode area, and of course reproducibility is also poor. Also, when application to semiconductor devices, etc., is considered, minute working technique is necessarily demanded, but the above method is not suited for this purpose at all. Further, as in coating of an electroconductive paint including a step of contact of an organic solvent with monomolecular built-up film, there may be the influence of the solvent, namely film dissolution or film structure change at the coated portion or the vicinity thereof, sometimes leading to deterioration of device characteristics such as lowering in conductivity during equipment of electrodes.

SUMMARY OF THE INVENTION

Accordingly, an object of the present invention is to provide a working technique (patterning technique) by post-treatment of an electroconductive monomolecular film or monomolecular built-up film and an electroconductive film resulting from said patterning. More specifically, the object resides in providing said polymerizable film in which the electrical characteristic of said electroconductive film are changed according to the desired pattern and a method for working thereof.

Another object of the present invention is to remove the drawbacks of the method for providing an electrode in the prior art example and provide a method for providing an electrode onto conductor, particularly a novel method for providing electrode suitable for applying electroconductive film for the field of electronics, above all molecular electronics.

It is another object of the present invention to provide a novel method for providing electrodes which can form electrodes in any desired shape, is also high in reproducibility and suitable for fine working.

Still another object of the present invention is to provide a novel method for providing an electrode which has no adverse influence on the device characteristics at the electrode portion during the providing of the electrode.

Still another object of the present invention is to provide a novel method for providing an electrode which enables not only provision of the external connecting electrodes onto the organic film, but also provision of internal connecting electrodes which connect the desired sites in between the layers of an anisotropic organic film such that insulating layers and electroconductive layers are laminated repeatedly alternately.

Further, another object of the present invention is to provide a method for preparing an electrical circuit comprising a monomolecular film or monomolecular built-up film having an electroconductive region in any desired pattern shape according to the simple post-treatment.

According to an aspect of the present invention, there is provided an electroconductive film having a region (A) of a lamination layer comprising an electroconductive layer and an insulating layer, and a region (B) having electroconductivity reduced or eliminated.

According to another aspect of the present invention, there is provided an electroconductive film having a region (C) of a lamination layer having polymerizable double bonds and comprising an electroconductive layer and an insulating layer, and region (D) having been denatured by polymerization and exhibiting changed dissolution characteristics.

According to still another aspect of the present invention, there is provided a patterning method, comprising exposing an electroconductive film having electroconductive layers and insulating layers laminated alternately to an energy beam which reduces or eliminates partially electroconductivity of said film.

According to a further aspect of the present invention, there is provided a patterning method comprising exposing an electroconductive film having a polymerizable double bonds and having electroconductive layers and insulating layers laminated alternately to an energy beam which changes locally the solubility of the film.

According to a still further aspect of the present invention, there is provided a method for providing an electrode on an electroconductive member having a laminated constitution with electroconductive layers and insulating layers laminated alternately, comprising forming terminal ends of the respective conductive layers isolated by said insulating layers into a shape of steps, and equipping the electrode on a portion in said shape of steps.

According to a still further aspect of the present invention, there is provided a method for providing an electrode, which comprises forming a peeled portion by exposing an organic film provided on a substrate to energy irradiation, and providing an electrode on said peeled portion.

DESCRIPTION OF THE PREFERRED EMBODIMENTS OF THE INVENTION

The method for working the electroconductive film of the present invention comprises exposing a monomolecular film or monomolecular built-up film having electroconductivity formed on a support to an energy beam according to a desired pattern to modify said exposed site.

As the method for forming a pattern by exposure to an energy beam, there have been already known in the field of inorganic semiconductors a method in which a film is locally heated to be removed by vaporization by irradiation of a high luminance electron beam or high output laser beam or a method according to the sputtering working by use of a convergent ion beam. However, since these methods require high energy, and therefore involve many problems such that there is influence on the materials other than the object to be removed, namely the substrate or the vicinity of the irradiated portion may be heated more than necessary, that the device becomes complicated and enlarged, and also since sputtering working is generally slow in working, the chemical effect such as chemical etching, etc., is required to be used in combination.

On the other hand, since the electroconductive film to be used in the working method of the present invention is formed on the support as a monomolecular film or monomolecular built-up film of an electroconductive starting material, it has the specific features that (1) it is an organic material, and (2) it is a very thin film, and further (3) the film properties, namely electroconductivity as mentioned in the present invention is greatly attributable to the orientation, arrangement (orderliness of the structure) of the film forming molecules. The present invention has accomplished easily the problems of the prior art as described above in consideration of these specific features. That is, (1) working at low energy is possible, (2) workability is increased, and consequently (3) the method and the device can be simple. Further, (4) reduction or elimination of electroconductivity can be effected by merely disturbing the order of the film structure by low energy beam irradiation without causing vaporization. In this method, (5) degree of freedom of energy beam source becomes greater.

The starting material for the electroconductive member is a compound having at least one hydrophobic site and at least one hydrophilic site in the molecule, and various starting materials for various organic electroconductive members known in the art can be used. As the element constituting the hydrophobic site, there may be included various hydrophobic groups such as alkyl groups, and examples of the hydrophilic site may include carboxyl groups, hydroxyl groups, amino groups, etc.

As the material constituting the support, there may be employed plates or films composed of various insulating materials such as glass, ceramic, plastic, etc.

Such electroconductive film may be produced by, for example, the LB method, as described below.

Figure 1A:
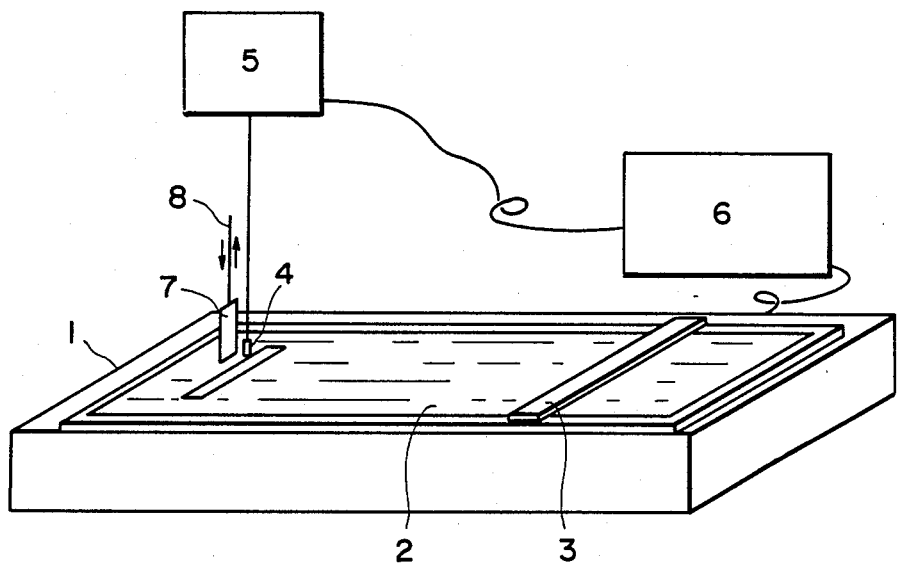
FIG. 1A and FIG. 1B show a perpsective view and a longitudinal sectional view showing an example of the film forming device used for practicing the present invention, respectively.
Figure 1B:
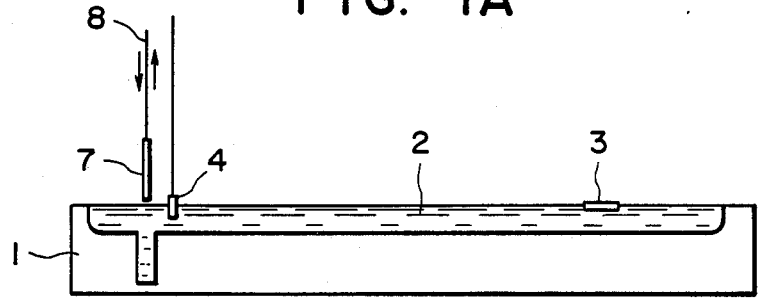

First, a starting material for organic electroconductive member is dissolved in a volatile solvent such as benzene, chloroform, etc., and the resultant solution is spread by use of a cylinder, etc., on the aqueous phase 2 in the water tank 1 of the monomolecular film forming device shown in FIG. 1. Said starting material molecules, in the couse of evaporation of the solvent, separate out in a shape of a film with the hydrophilic groups directed to the aqueous phase 2 and the hydrophobic groups directed to the gas phase.

Subsequently the spreading area is restricted by a moving barrier wall 3 (or a buoy) so that the separated matter (molecules of the starting material) may not be spread excessively through free diffusion on the aqueous phase 2 to obtain a surface pressure $\pi$ which is in proportion to the gathered state of the film material. By measuring the surface pressure $\pi$ by a surface pressure gauge 5 having a surface pressure sensor 4, moving the shifting barrier wall 3 by a surface pressure controlling device 6 to control the gathered state of the film material by reducing the spreading area and elevate gradually the surface pressure, whereby the surface pressure $\pi$ suitable for preparation of the built-up film can be given. While the surface pressure is maintained by the surface pressure control device 6, a clean support 7 is gently moved vertically up and down by the vertical carrier 8 for the support to have the monomolecular film of the starting material transferred onto the support. The monomolecular film is thus formed, and the monomolecular built-up film can be formed to a desired built-up number of layers by repeating of above operation.

For transfer of monomolecular film onto the support, other than the above vertical dipping method as described above, such method as the horizontal lifting method, rotatory cylinder method, etc., can be also applied. The horizontal lifting method is the one in which transfer is effected by permitting the support to contact horizontally the water surface, while the rotatory cylinder method is the one in which monomolecular layer is transferred onto the support surface by rotating a cylindrical support on the water surface. In the vertical dipping method as described above, when the support is dipped in the direction transversing the water surface, the first layer is formed in such a manner that monomolecular layer with the hydrophilic group directed to the support, side is formed on the substrate. By moving up and down the support as described above, monomolecular layers are superposed one sheet at each step successively. Since the orientation of the film forming molecules are opposite in the drawing-up step and the dipping step, and thus this method allows the formation of a Y type film in which hydrophilic groups are faced to hydrophilic groups, and hydrophobic groups faced to hydrophotic groups between the respective layers.

In contrast, the horizontal lifting method is the one in which transfer is effected by permitting the substrate to contact horizontally the water surface, and monomolecular layers with hydrophobic groups directed to the support side are formed on the support. When built up according to this method, there is no alteration in the direction of the film forming molecules, but there is formed an X type film in which the hydrophobic groups are directed toward the support side in all the layers. On the contrary, the built-up film with the hydrophilic groups directed to the support side in all the layers is called a Z type film.

The method for transferring monomolecular layers onto the support is not limited to these methods, but when a support with a large area is employed, a support may be extruded from a roll into the aqueous phase. Also, the directions of the hydrophilic groups or hydrophobic groups to the substrate are given as a general rule, and they can be also changed by the surface treatment of the support, etc.

The working method of the present invention practices exposure of the electroconductive monomolecular film or monomolecular built-up film thus obtained to an energy beam locally according to a desired electroconductive pattern. By exposure to the energy beam, the exposed portion is subject to destruction of the electroconductive structure of the monomolecular film or occurrence of peel-off of the film, whereby electroconductivity is lowered or eliminated to form electroconductive regions and insulating (or electroconductivity-lowered) regions in a shape of a pattern.

The method is referred to as method [a] hereinafter.

As the energy beam to be used for irradiation, there may be employed light or heat (e.g. a laser beam, a UV-ray), flux of particles (e.g. an ion beam, an electron beam), etc. The intensity of the energy beam required for working may differ depending on the kind of the energy beam employed, the kind of the electroconductive member and the built-up number of the monomolecular built-up films, but generally no special great energy intensity is not required. For example, an electron beam or an ion beam accelerated to about several to 100 KV may be sufficient. In the ion beam, although ion species with large mass are desirable, those with small mass can be employed. For example, the proton beam for resist exposure used in the field of semiconductors can be readily applied. Also in the light beam, for example, a laser beam with an output of several to some 10 mW can be used and therefore working by the semiconductor laser under the present situation is possible.

Since such energy beam can be employed to scanning or masking, it can be projected easily onto any desired region.

In addition to the working method [a] mentioned above in which working (patterning) is effected by exposure of the electroconductive film to an energy ray, the working method [b] as described below can be also used in the present invention.

In the method [b], an energy beam is projected onto an electroconductive film containing a compound having a polymerizable double bond, and working is effected through the difference in solubility in a solvent between the polymerized portion and the unpolymerized portion of the electroconductive film caused by the energy beam.

In the following, the method [b] is described in detail. The electroconductive film having polymerizable double bonds to be used in the method [b] may be obtained by use of, for example, a tetracyanoquinodimethane complex represented either one of the following formulae No. 1 to No. 3:

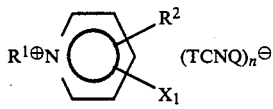
No. 1

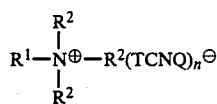
No. 2

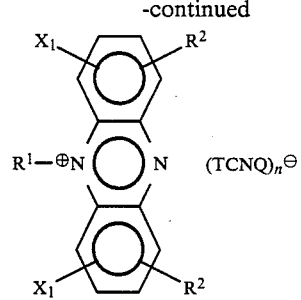
No. 3 wherein $R^1$ represents a long chain alkyl or alkenyl group, $R^2$ represents hydrogen or a short chain alkyl or alkenyl group, at least one of $R^1$ and $R^2$ is an alkenyl group, $X_1$ represents hydrogen, halogen, a cyano group or an alkoxy group, TCNQ represents tetracyanoquinodimethane or a derivative thereof, and n represents 1 or 2.

In the above formulae, $R^1$ which is a long chain alkyl or alkenyl group may be preferably one having about 5 to 30 carbon atoms. $R^2$ which is a short chain alkyl or alkenyl group may be preferably one having up to about 10 carbon atoms. X may be preferably hydrogen, but it may also be a halogen atom such as chlorine, fluorine, etc., a cyano group or a lower alkoxy group such as methoxy. As TCNQ, tetracyanoquinodimethane itself may be preferably used, but its derivative may be also available. As the TCNQ derivatives, those substituted with alkyl groups or halogens, etc., at 2-, 3-, 5- or 6-position may be included.

Examples of such tetracyanoquinodimethane complexes may include those shown below:

No. 4

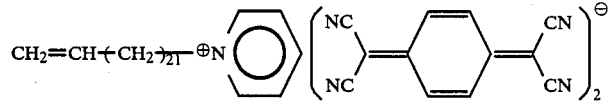
No. 5

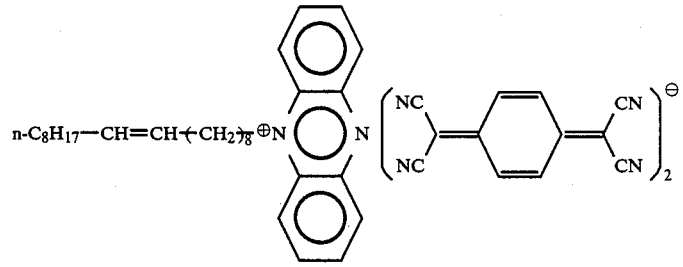
No. 6

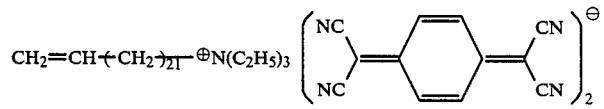
No. 7

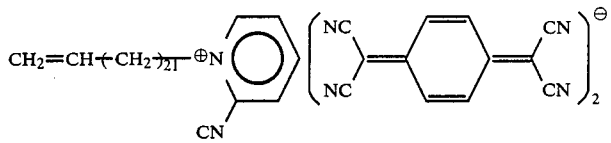
No. 8

The above tetracyanoquinodimethane complex may be formed into monomolecular film or monomolecular built-up film according to the LB method similarly as described above. The tetracyanoquinodimethane complex forming electroconductive film thus obtained which has polymerizable double bonds (alkenyl groups), can be polymerized by exposure to an appropriate energy beam such as an electron beam or a UV-ray. Also, even when polymerized, electroconductivity of tetracyanoquinodimethane complex is not greatly changed, and therefore the polymerized film on the substrate has also electroconductivity. However, the monomolecular film or monomolecular built-up film before polymerization and the polymerized film obtained by polymerization thereof differ greatly from each other in solubility in a solvent, and therefore etching removal treatment with a solvent is possible for the unpolymerized film. Accordingly, the monomolecular film or monomolecular built-up film of the tetracyanoquinodimethane complex on the substrate after irradiation with an energy beam according to a desired circuit pattern to polymerize the irradiated portion, and then removing the unpolymerized portion by dipping in an appropriate solvent, an electroconductive film having a desired circuit pattern can be prepared.

Said electroconductive film, namely an organic electroconductive material can be used as the organic wiring member for electronic devices.

Next, in order to employ effectively the electroconductive film of the present invention formed of a monomolecular film or monomolecular built-up film in the field of electronics, particularly the field of molecular electronics, the method is described for providing an electrode to equip a conductor having a laminated constitution with said electroconductive layers and insulating layers laminated alternately with an electrode.

One is to provide an electrode according to the method [c].

In the method [c], the terminal ends of the respective electroconductive layers isolated by said insulating layers are formed in a shape of steps, and the portions in a shape of steps are provided with electrodes.

In the following, the method [c] is to be described.

Figure 5:
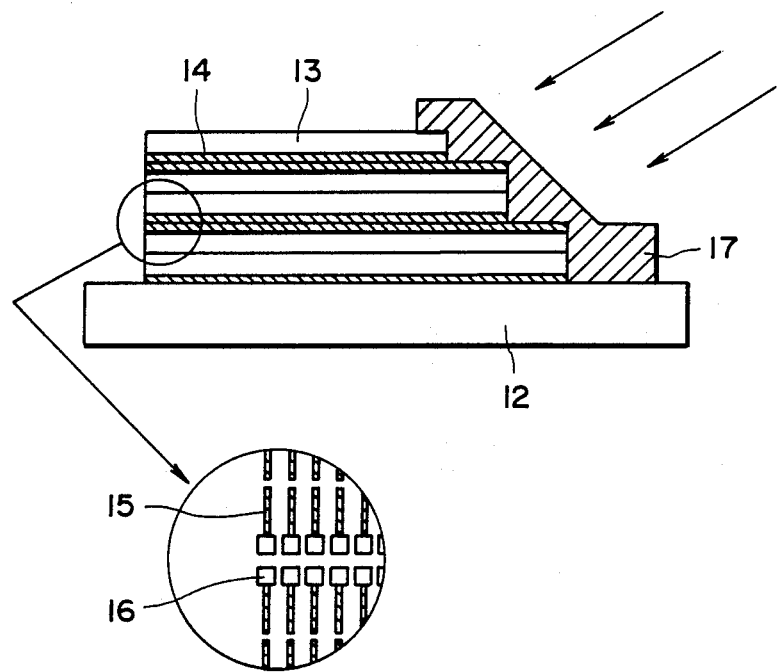
FIG. 5 and FIG. 6 are schematic illustrations of one embodiment of the present invention, FIG. 5 showing a sectional view of the substrate for illustrating the state where electrodes are equipped on the monomolecular built-up film formed in a shape of steps on the substrate and FIG. 6 showing the perspective view of FIG. 5.
Figure 6:
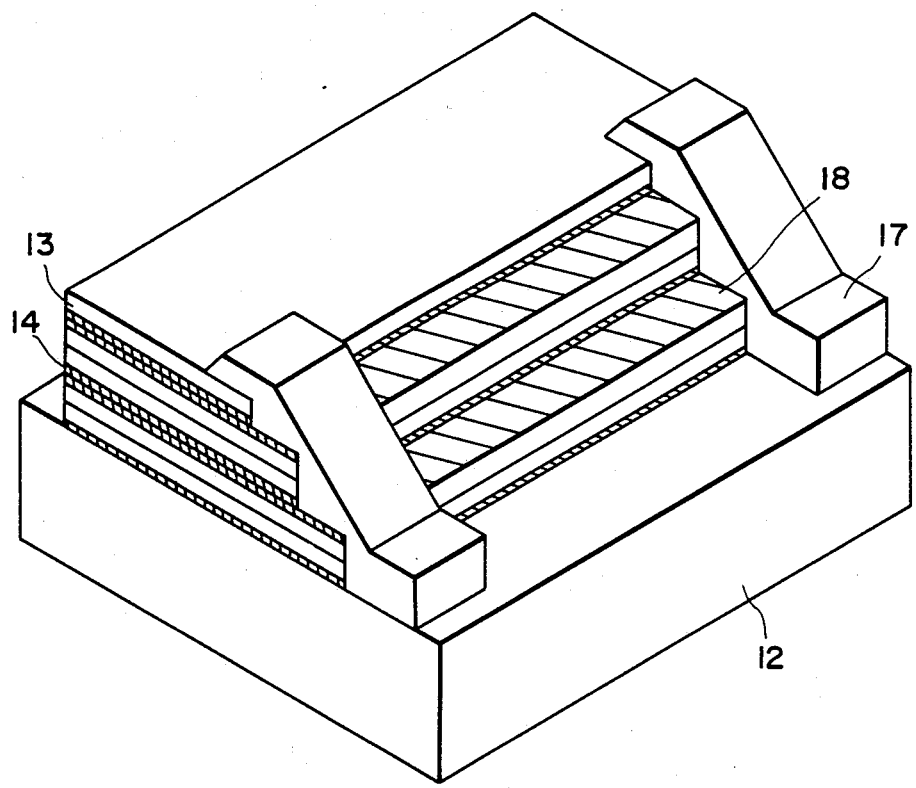
Figure 8:
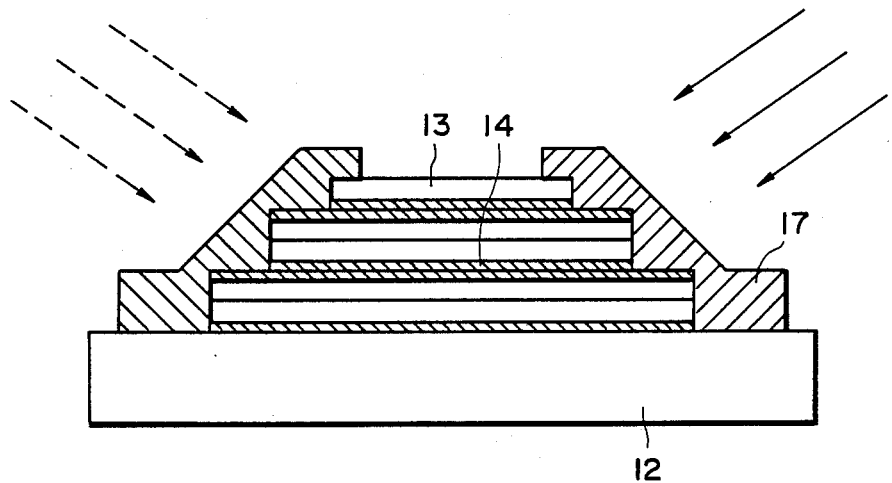
FIG. 8 is an illustration of another embodiment of the present invention.

For example, as shown in FIG. 5, FIG. 6 or FIG. 8 as described below, the terminal ends of the conductor are shaped in steps, and said step-shaped portions are equipped with electrodes. Accordingly, the exposed area of the electroconductive layers at the conductor terminal ends equipped with electrodes is increased to increase the contact area between the electrodes and the electroconductive layers where said electrodes are equipped, whereby there will occur no insufficient conduction between the respective electroconductive layers isolated by insulating layers as in the prior art. Also, since the contact strength between the electroconductive layers and electrodes can be increased by increased contact area with electrodes, no peel-off of electrodes, etc., will occur. In a preferred embodiment of the electrode equipment method, an electroconductive film exhibiting the terminal ends shaped in steps as mentioned above is formed by utilizing the LB method.

More specifically, for example, in transferring the organic polymer having electroconductivity as mentioned above onto a substrate according to the LB method, transfer of the condensed film is conducted according to the vertical dipping method, and the thin terminal ends are shaped in steps by shifting the turning points of the vertical movement of the substrate gradually toward the middle of the substrate. Of course, the horizontal lifting method or the rotary drum method can be employed, and in the case of employing the horizontal lifting method, the terminal ends may be shaped in steps by carrying out film formation by reducing the spreading area of the condensed film to be transferred for every time. Also, in the case of employing the rotatory drum method, film formation may be effected by gradually reducing the rotation width of the substrate similarly as in the above vertical dipping method.

Specific examples of the organic compound having electroconductivity may include No. 9 to No. 21 shown below:

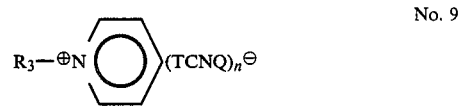
No. 9

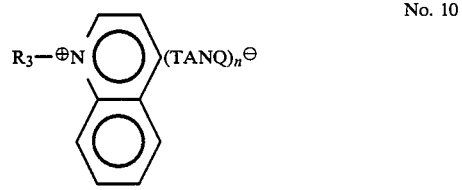
No. 10

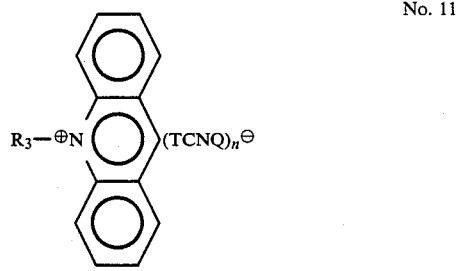
No. 11

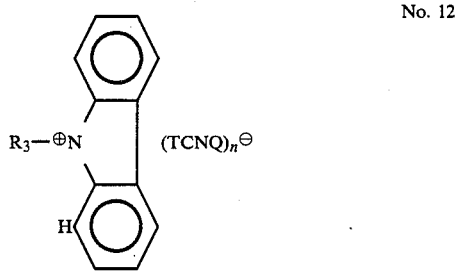
No. 12

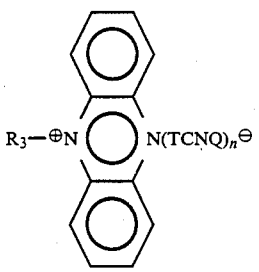
No. 13

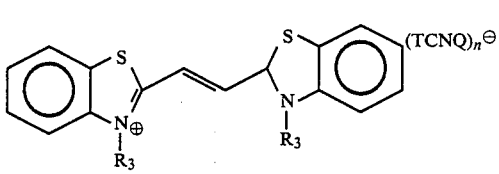
No. 14

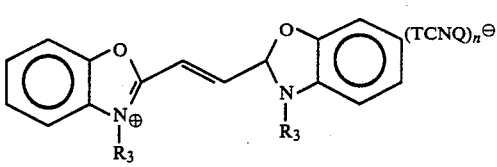
No. 15

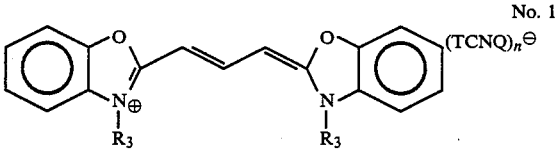
No. 16

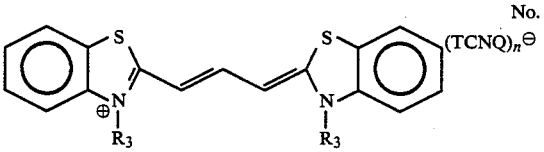
No. 17

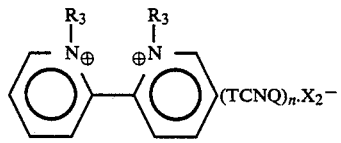
No. 18

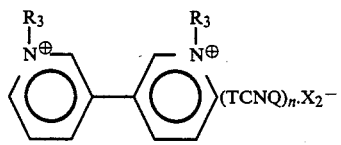
No. 19

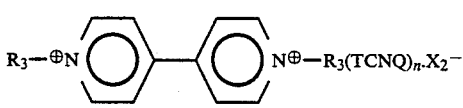
No. 20

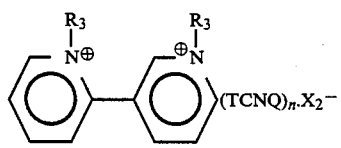
No. 21 wherein $R_3$ represents a straight chain alkyl group, preferably having about 8 to 30 carbon atoms, TCNQ represents

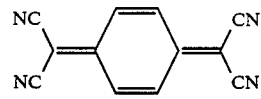

n represents an integer of 1 or 2, $X_2$ represents a halogen atom or $PF_6^-$, etc.).

As the method for equipping said film terminal ends thus formed in shape of steps with electrodes, in consideration of prevention of mechanical or chemical breaking of the film as mentioned above, it is preferable to laminate electrodes with a desired pattern at said step-shaped portions according to the film forming method such as vapor deposition, sputtering, the chemical vapor deposition method (CVD method), etc. As the electrode materials, various metals may be preferably used, but either organic or inorganic material may be useful, provided that it has electroconductivity.

Although not specifically described above, the repsective electroconductive layers and insulating layers, when constituted of inorganic materials, may be formed by utilizing the film forming method such as the above vapor deposition, sputtering, the chemical vapor deposition method (CVD method), etc., and the terminal end portions may be patterned in a shape of steps by use of a mask pattern or resist during formation of the respective layers.

According to such electrode providing method of [c], formation of electrodes can be effected without causing mechanical or chemical breaking of film, and also a large number of electroconductive layers can be effectively utilized as current passages.

Also, as the method for providing an electrode on the electroconductive film formed of a monomolecular film or monomolecular built-up film of the present invention, there is another effective equipment method other than [c], that is the method [d] as described below.

In the method [d], a peeled portion is formed by energy irradiation onto the electroconductive film and said peeled portion is equipped with electrodes.

Figure 14A:
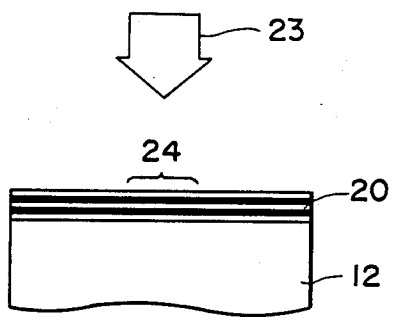
FIGS. 14A through 14C are diagrams for illustration of the basic embodiment of the method for providing an electrode according to the method [d] of the present invention.
Figure 14B:
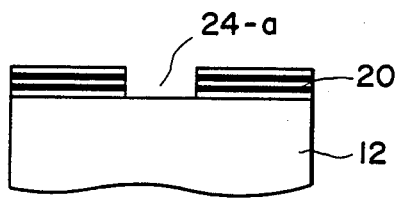
Figure 14C:
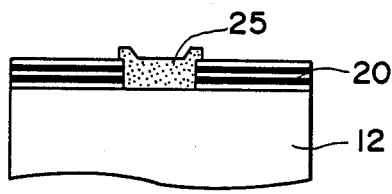

In the following, the method [d] is described in more detail. FIGS. 14A through 14C show the basic embodiment of the method [d]. That is, in the method [d], ordinarily prior to equipment of electrodes, peeled portion is formed by effecting energy irradiation on the organic film on the support, and electrodes are equipped at said peeled portion. Specifically, for example, the electroconductive film 20 provided on the support (the substrate 12 in this example) as shown in FIG. 14A is subjected to energy irradiation 23 to peel off the electroconductive film 20 at said irradiated region to form a peeled portion 24-a as shown in FIG. 14B, and thereafter electrodes 25 are equipped by filling an electrode material in said peeled region 24-a as shown in FIG. 14C.

As the energy irradiation to be employed in the present invention, for example, light or heat such as a laser beam, a UV-ray, or sound such as sonication, etc., and further flux of particles such as an ion beam, an electron beam, etc., may be employed as preferable ones. Energy irradiation may differ depending on the size of the desired peeled portion, but it is preferably effected by way of spot irradiation from the standpoint of working precision.

As the support for supporting the electroconductive film on which such energy irradiation is effected, the substrate as described above may be employed as representative one. The substrate may be either electroconductive or insulating, and the material is not particularly limited, and either inorganic or organic materials may be employed. Also, the support, other than such substrates, for example, a semiconductor device having an organic film as the functional layer for the purpose of improvement of insulating property provided thereon and also having electrodes equipped by peeling-off of said film.

The electroconductive film subjected to energy irradiation in the present invention can be made any desired one corresponding to the desired device characteristics, etc. For example, when anisotropy is desired, it may be constituted of a monomolecular film or monomolecular built-up film comprising an organic compound having at least hydrophilic site and hydrophobic site in the molecule. When the above monomolecular film or monomolecular built-up film is desired, the LB method as described above may be preferably employed. Otherwise, the film forming method such as vapor deposition, sputtering, the chemical vapor deposition method (CVD method), etc., may be employed.

Also, the electrode providing method according to[d] can be applied to other cases than the electroconductive film having both electroconductive layer and insulating layer of the present invention, and the electrodes can be equipped similarly even on the organic film exhibiting either one of electroconductivity or insulating property.

As the method for providing an electrode at the peeled portion formed, there may be employed filling of electrode material in said peeled portion by utilizing the film forming method such as vapor deposition, sputtering, the CVD method, etc., or the method by coating of a low melting metal or graphite, etc., as specific examples. However, in view of prevention of mechanical or chemical damage of the organic film, the film forming method such as vapor deposition, sputterring, the CVD method, etc., as mentioned above may be preferably employed. As the electrode material, various metals are preferred, but either organic or inorganic material can be used, provided that it has electroconductivity.

Although not particularly described above, in the present invention, it is also possible to perform simultaneously both peeling of the organic film by energy irradiation and filling of electrode material into the peeled portion. In such a case, it is preferable to perform filling of a metal material such as Cr or tungsten simultaneously with or subsequently to peeling of the organic film by applying, for example, the method by use of laser excitation reaction (Journal of Electrochemical Society, vol. 128, 1981 p. 2039) which is one kind of the CVD method proposed by D.L. Ehrlich et al.

In the electrode providing method [d], since electrodes are equipped by peeling off the organic film by energy irradiation, for example, parameters influencing greatly the electrical characteristics such as interelectrode distance or electrode area can be controlled with good precision and yet with good reproducibility. That is, as different from the mechanical peeling as in the prior art, the peeled portion becomes orderly as shown in FIG. 14 described above, and further fine working by spot irradiation is possible, and also no organic solvent as in coating of electroconductive paint is particularly required, whereby equipment of electrodes is possible without causing chemical or mechanical damage of film without deterioration of device characteristics such as lowering in conductivity.

The present invention is described in more detail by referring to the following Examples.

EXAMPLE 1-1

A solution of bis-tetracyanoquinodimethane docosylpyridinium

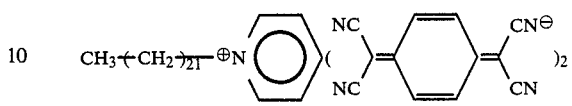

dissolved at a concentration of 1 mg/ml in 1:1 solvent mixture of acetonitrile and benzene was spread on the surface of an aqueous solution (temperature 17° C.) containing $CdCl_2$ at a concentration of $4 \times 10^{-4}$ mol/liter and adjusted to pH 6.8 with KHCOhd 3. After evaporation of the solvent mixture, the surface pressure was elevated to 20 dyn/cm and a monomolecular film of the above compound was formed on the surface.

Figure 2:
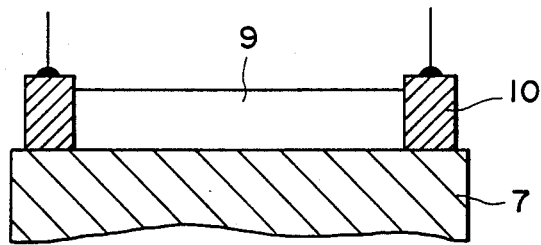
FIG. 2 and FIG. 3 show schematic illustrations showing the working of the electroconductive film according to the method of the present invention.

A cleaned glass substrate (30×10 mm) subjected to the hydrophobic treatment of the surface (having three layers of monomolecular film of cadmium arachidate built up according to the LB method) was used as the support 7, and the substrate was gently dipped about 20 mm at a speed of 15 mm/min in the direction transversing the water surface, and then withdrawn gently at a speed of 10 mm/min to provide two layers of the monomolecular film of the above compound built up. By repeating this operation for 30 times, a monomolecular built-up film 9 of the above compound was formed on the glass substrate. Next, on the ends of the surface of the substrate, external connecting electrodes 10 were formed by use of silver paste as shown in FIG. 2, and the current voltage characteristic of this monomolecular built-up film 9 was measured. As the result, the inter-electrode resistance of this film was found to be 1.2 KΩ.

Figure 3:
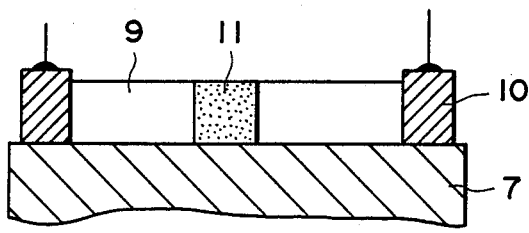

Further, such device was placed in a vacuum vessel, and an electron beam with a charge density of 200 $\mu c/cm^2$ accelerated at 20 KV was projected from above the film surface to the electroconductive film 9 vertically on the film surface by scanning perpendicularly to the direction in which the electrodes are opposed to each other. As the result of observation by an optical microscope, trace of damage was recognized on the film of the irradiated site 11 as shown in FIG. 3, but the damage did not cause disappearance of the portion of the film. The inter-electrode resistance of this device was found to be 20 MΩ or higher which is the limit of measurement, and thus it was confirmed that lowering or disappearance of electroconductivity occurs without accompaniement of disappearance of the film.

On the other hand, an electron beam accelerated at 100 KV was provided by scanning similarly as in the above experiment on the device shown in FIG. 2, and it was found by observation with an optical microscope that the irradiated site (not shown) had disappeared. Of course, the inter-electrode resistance at this time was higher than the measurement limit (20 MΩ), thus forming an insulating material.

However, as shown by the above experimental result, without evaporation of the electroconductive region (film), namely by irradiation of a low energy, formation of insulating region can be effected and even after formation working substantially without loss of smoothness could be realized.

In this Example, an insulating region in a very simple shape was formed, but complicated and fine working can be also practiced by controlling the scanning direction of the electron beam.

Also, although electron beam was used, the same result can be obtained by use of an ion beam and in this case by providing a mask above the film, any desired pattern can be formed without scanning of the beam.

EXAMPLE 1-2

A solution of bis-tetracyanoquinodimethane docosylacridinium

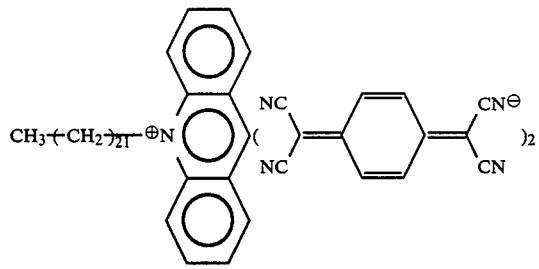

dissolved at a concentration of 1 mg/ml in a 1:1 solvent mixture of acetonitrile and benzene was spread on pure water of 15° C., and a device shown in FIG. 2 comprising a monomolecular built-up film of the above compound was prepared according to the same method as in Example 1-1. The inter-electrode resistance was 750 $\Omega$. Further such device was placed in a vacuum vessel similarly as in Example 1-1, and an electron beam with charge density of 200 $\mu C/cm^2$ accelerated at 200 KV was projected from above the film surface to the electroconductive film 9 vertically to the film surface by scanning perpendicularly to the direction in which the electrodes are opposed to each other. When observed by an optical microscope, trace of damage was recognized on the film at the irradiated site 11 as shown in FIG. 3, but it did not completely disappear. The inter-electrode resistance of this device is 20 M$\Omega$ or higher which is the measurement limit, and the same effect as in Example 1-1 was confirmed even in the case where different starting material for the electroconductive member may be employed.

EXAMPLE 1-3

The device shown in FIG. 2 prepared in Example 1-1 was placed in air under 20° C., and a semiconductor laser (central wavelength 830 nm, output 8 mW, beam diameter 1 $\mu m$) was projected from above the film surface to the electroconductive film 9 vertically to the film surface by scanning at a speed of 2 mm/sec perpendicularly to the direction in which the electrodes are opposed to each other similarly as in Example 1-1. When observed by an optical microscope, trace of melting of the film at the irradiated site 11 was recognized as shown in FIG. 3 but it did not completely disappeared. The inter-electrode resistance of this device is 20 M$\Omega$ or higher which is the measurement limit similarly as in Example 1-1, and it was confirmed that lowering or disappearance in electroconductivity of the film also occurred by the irradiation of the light beam.

In this Example, a laser beam of 830 nm was employed, but the same results can also be obtained with a light beam which is not limited to visible light and may be in the UV or IR regions, provided that it is a light beam absorbable in such monomolecular built-up film, and the degree of freedom with respect to light source may be said to be great.

EXAMPLE 1-4

The device shown in FIG. 2 prepared in Example 1-1 was placed in air under 20° C., and a semiconductor laser (central wavelength 830 nm, output 3 mW, beam diameter 1 $\mu m$) was irradiated from above the film surface to the electroconductive film 9 vertically to the film surface by scanning at a speed of 2 mm/sec perpendicularly to the direction in which the electrodes are opposed to each other similarly as in Example 1-1. When observed by an optical microscope, substantially no change was observed even at the irradiated site. Also, this device was found to exhibit the same value of inter-electrode resistance of about 1.2 K$\Omega$ as before irradiation. Next, when this device was subjected to laser irradiation under the same conditions as described above except for under the environment of the device temperature of about 50° C. by placing on an implement heated and controlled at 50° C., trace of melting of the film at the irradiated site 11 shown in FIG. 3 was recognized by optical microscope observation. The inter-electrode distance of the device at this time was 20 M$\Omega$ or higher which is the measurement limit similarly as in Example 1-1, and it was confirmed that pattern formation is possible by combination with the substrate heating treatment, even if the irradiated light energy may be small.

In this Example, a combination of substrate heating and light beam irradiation was shown, but other than the above example, the same result can be obtained by simultaneous irradiation of two kinds or more of energy beams such as heat, light, an electron beam, an ion beam, etc.

EXAMPLE 2-1

After tetracyanoquinodimethane complex represented by the structural formula No. 5 as mentioned above was dissolved at a concentration of $3 \times 10^{-3}$ mol/liter in benzene-acetonitrile (1:1) solvent mixture, the solution was spread on pure water of 20° C. After evaporation of the solvent, the surface pressure was elevated to 30 mN/m and tetracyanoquinodimethane complex separated in a shape of a film. While the surface pressure was maintained constant, a clean glass substrate as the carrier, was moved gently up and down in the direction transversing the water surface at a speed of 10 mm/min to have monomolecular films of tetracyanoquinodimethane transferred onto the substrate, thus forming three kinds of substrates with 31, 61 and 101 layers being built up.

On these substrates, an electron beam was irradiated following desired wiring pattern under the conditions of application voltage of 20 KV, current value of $8 \times 10^{-11}$ A and exposure time of 0.5 $\mu$ sec to polymerize the monomolecular built-up film of tetracyanoquinodimethane complex at the irradiated portion. Then, these substrates were dipped into ethanol to remove the monomolecular built-up film at the non-exposed portion, thereby forming an organic wiring member. For each of the wiring members thus obtained, the resistivity between arbitrary two points on the conductive polymer film was measured. As the result, it was found to be 100 $\Omega$·cm or lower each case, whereby it was confirmed that they are useful as organic wiring members.

EXAMPLE 2-2 and 2-3

Organic wiring members were formed in entirely the same manner as in Example 2-1 except for forming monomolecular built-up films each with 61 layers being built-up by use of tetracyanoquinodimethane complexes represented by the formulae No. 6 and No. 7 as mentioned above in place of the tetracyanoquinodimethane complexes represented by the structural formula No. 5 as mentioned above. These wiring members were also found to have good performances similarly as those in Example 2-1.

EXAMPLE 3-1

After bis-tetracyanoquinodimethane docosylpyridinium represented by the formula No. 9 shown below was dissolved at a concentration of 1 mg/ml in a 1:1 solvent mixture of acetonitrile and benzene, the resultant solution was spread on aqueous phase (water temperature 17° C.) with a $CdCl_2$ concentration of $4 \times 10^{-4}$ mol/liter controlled to pH 6.8 with $KHCO_3$.

No. 9

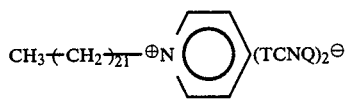

wherein TCNQ represents

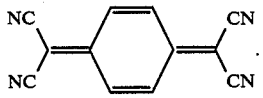

The molecule represented by this formula No. 9 has both hydrophobic and hydrophilic portions in the molecule with

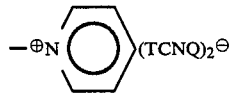

being as the hydrophilic site and $CH_3 (CH_2)_2$ being as the hydrophobic site, and in the monomolecular built-up film constituted by said molecule, the hydrophobic site forms an insulating layer and the hydrophilic site and electroconductive layer.

Figure 4:
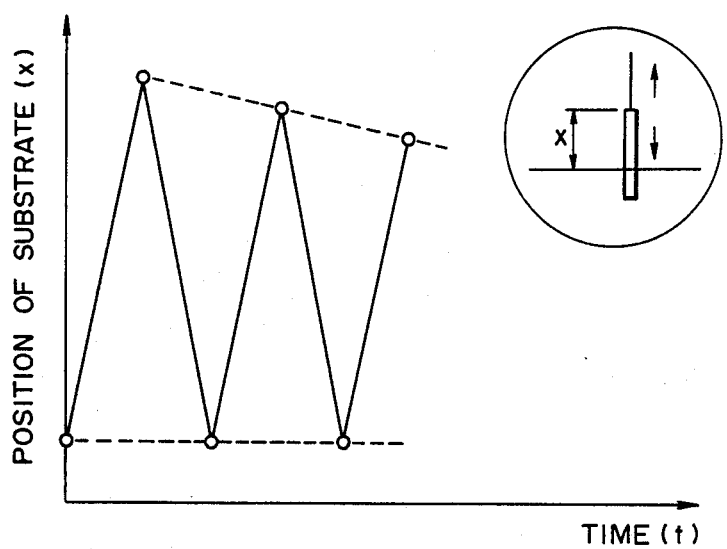
FIG. 4 is a graph for illustration of an example of the film forming operation for the substrate when the conductor terminal ends are shaped in a form of steps by application of the LB method.

Next, after evaporation of the solvents of acetonitrile and benzene, the surface pressure was elevated to 20 dyn/cm to form a monomolecular film. While the surface pressure was maintained constant, a clean glass substrate previously dipped into the aqueous phase was gently drawn up about 20 mm at a speed of 10 mm/min in the direction transversing the water surface, subsequently dipped gently 20 mm at a speed of 10 mm/min to have two layers of monomolecular film built up on the substrate. Next, the substrate was drawn up again at the same draw-up speed of 10 mm/min as above, but this time the draw-up distance of the substrate is shortened by 0.5 mm than the previous time, and subsequently the substrate was dipped gently at a speed of 10 mm/min to have further laminated to layers of monomolecular built-up films on the above two layers of monomolecular built-up films (see FIG. 4). Thus, by repeating the film operation in which the draw-up distance is shortened by 0.5 mm for every time, the draw-up operation of the eleventh time was completed, whereupon the substrate was completely drawn up after complete removal of the monomolecular film on the water surface whereby the hydrophobic sites 15 and the hydrophilic sites 16 were alternately regularly arranged as shown in FIG. 5 to give a monomolecular built-up film comprising 21 layers as the total having insulating layers 13 constituted by the hydrophobic sites 15 and electroconductive layers 14 constituted by the hydrophilic sites 16 alternately formed on the substrate. In this case, the film of the 21th layer is formed with the insulating layer 13 exposed as shown in FIG. 5, but of course, the film forming operation may be completed with the electroconductive layer 14 being exposed by drawing up completely the substrate after complete removal of the monomolecular film on the water surface on completion of the dipping operation.

The monomolecular built-up film thus obtained on the substrate exhibits the shape of steps as shown in FIG. 5 on the side nearer to the water surface, with a part of the electroconductive layer (the portion indicated by the symbol 18 in the drawing) being exposed as shown in FIG. 6. By vapor deposition of aluminum as electrodes 17 with width of 2 mm and thickness 2000 Å on the both ends of the step-shaped portion electrodes 17 were equipped onto the conductors with the terminal ends formed in shape of steps. In the conductor thus obtained, electrodes 17 were connected to all of the respective electroconductive layers 14 separated by the insulating layers 13, and all of these electroconductive layers 13 could be effectively utilized as current passages. The resistance between both electrodes was measured to be about 10 K$\Omega$, which value was extremely smaller as the resistance value of about 200 K$\Omega$ in the case of using only the electroconductive layer of the uppermost layer as current passage.

In this example, the conductor was formed of a monomolecular built-up film, but the present invention is also applicable to the monomolecular polymerized film obtained by polymerization of such monomolecular built-up film.

EXAMPLE 3-2

In order to make also the opposite side to the terminal ends of the conductor made in a shape of steps in Example 3-1, a monomolecular built-up film comprising molecules of the formula No. 9 was formed on the substrate in the same manner in Example 3-1 except for performing the film forming operation according to the procedure as described below.

Figure 7:
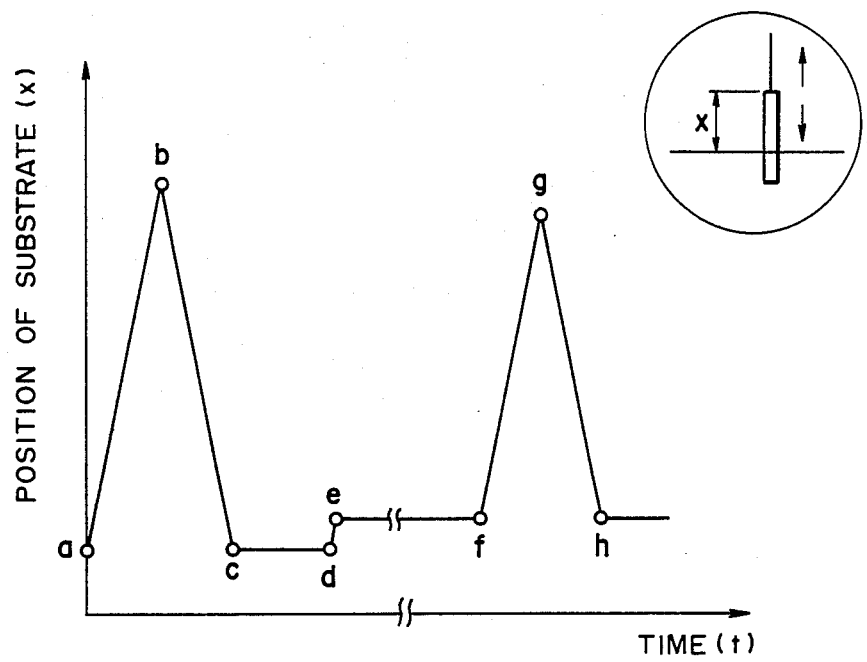
FIG. 7 is a graph showing another example of the film forming operation for the substrate in the case of forming the conductor terminal ends in a shape of steps by application of the LB method.

First, after the substrate was drawn up film the position shown by the symbol a to the position shown by the symbol b according to the same procedure as in Example 3-1 as shown in FIG. 7, it was again dipped from the position b to c, whereby a monomolecular built-up film of two layers was obtained. Next, after the monomolecular film on the water surface was completely removed under the state where the substrate was dipped into the aqueous phase as shown in FIG. 7 from the symbol c to d, the substrate was drawn up 0.5 mm as shown in FIG. 7 from the symbol d to e. Then, film forming molecules were again spread, and after elevation of the surface pressure, draw-up of the substrate (from f to g) and dipping (from g to h) were performed. However, the draw-up stopping position of the substrate was made lower by 0.5 mm than the draw-up stopping position in the previous time, similarly as in Example 3-1 (that is, if the stopping position in the previous time is b, the stopping position g in the next time is made lower by 0.5 mm than the stopping position b in the previous time).

The above procedure was repeated and on completion of the 11th draw-up operation, the monomolecular film on the water surface was completely removed and then the substrate was completely drawn up to obtain a monomolecular built-up film of the total 21 layers having insulating layers and electroconductive layers alternately laminated, and yet with their both ends being formed in a shape of steps, on the substrate as shown in FIG. 8. Next, on the whole surface, each of the step-shaped portion aluminum was vapor deposited to a thickness of 2000 Å to form aluminum electrodes 17. The distance between both electrodes was about 5 mm at the shortest portion, and the resistance between the electrode was found to be about 1 K$\Omega$.

EXAMPLE 3-3

Figure 9:
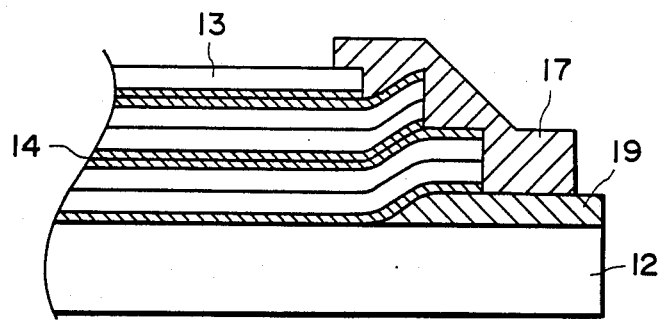
FIG. 9 is an illustration of still another embodiment of the present invention.
Figure 10:
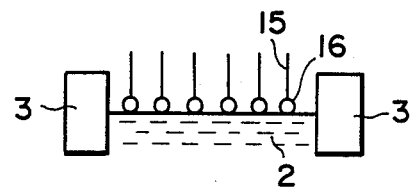
FIG. 10 is a schematic diagram for illustration of the outline of the LB method.
Figure 11:
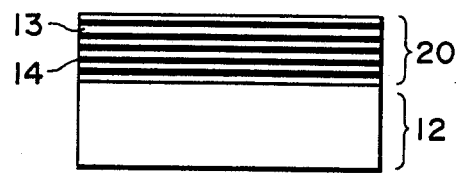
FIG. 11 is an illustration of the properties of the monomolecular built-up film formed according to the LB method.
Figures 12A, 12B:
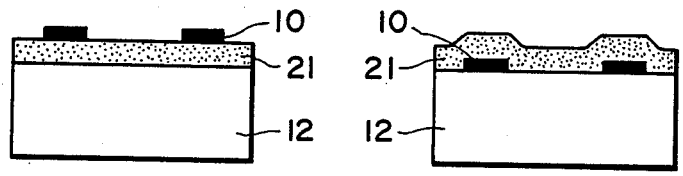
FIG. 12A, FIG. 12B and FIG. 13 are illustrations of the method for providing electrode of the prior art examples, respectively.
Figure 13:
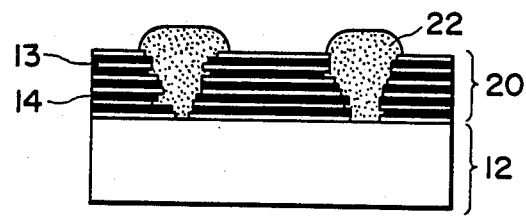

As shown in FIG. 9, after electrode 19 with desired pattern was formed previously on a glass substrate 12, according to the film forming operation as exemplified in Example 3-1 or Example 3-2, a monomolecular built-up film was obtained with the terminal ends being formed in shape of steps was obtained on said substrate 12. Next, by equipping the portions in shape of steps with aluminum electrodes 17 according to the same operation as described in Example 3-1 or Example 3-2, the conductor with terminal ends formed in shape of steps was equipped with the electrodes 17. The conductor thus obtained became improved in contact with the electroconductive layer of the lowest layer, whereby equipment of electrodes could be done more easily.

EXAMPLE 4-1

After bis-tetracyanoquinodimethane docosylpyridinium

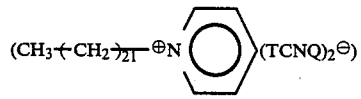

was dissolved at a concentration of 1 mg/ml in a 1:1 solvent mixture of acetonitrile and benzene, the resultant solution was spread on the aqueous phase (water temperature 17° C.) at a $CdCl_2$ concentration of $4 \times 10^{-4}$ mol/liter controlled to pH 6.8 with KHCOhd 3.

Next, after evaporation of the solvents of acetonitrile and benzene, the surface pressure was elevated to 20 dyn/cm to form a monomolecular film. While the surface pressure was maintained constant, with a clean glass substrate (30×10 mm) subjected to the hydrophobic treatment of the surface (having three layers of cadmium arachidate built up according to the LB method) as the support, said substrate was dipped about 20 mm gently at a speed of 15 mm/min in the direction transversing the water surface, and subsequently drawn up gently at a speed of 10 mm/min, thereby having a monomolecular film of two layers comprising the above bis-tetracyanoquinodimethane docosylpyridinium built up on the substrate. By repeating this operation for ten times, a monomolecular built-up film 26 comprising the total 20 layers of bistetracyanoquinodimethane docosylpyridinium was formed on the substrate 12.

Next, Ar laser irradiation (output 20 mW, beam diameter 1 $\mu$m) was effected from above the film surface of said monomolecular built-up film 26, to form two grooves on said film 26. Ar laser irradiation was effected at a scanning speed of 0.5 mm/s and the groove interval was made 4 mm.

Figure 15:
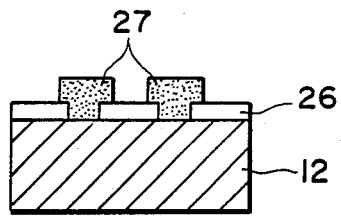
FIG. 15 is a diagram for illustration of another embodiment of the method [d] of the present invention.

Next, on the grooves, Ag as the electrode material was vapor deposited under vacuum according to the resistance heating method as shown in FIG. 15 (vapor deposition speed 1.5 nm/s, background pressure $2 \times 10^{-6}$ Torr, film thickness 200 nm) to form a pair of opposed electrodes 27.

According to entirely the same method as described above, 10 devices as the total having the above Ag electrodes 27 were prepared.

For the total 10 devices prepared as described above, the current voltage characteristics of the respective devices were measured to determine the average value $\sigma$ of the conductivity in the film interplanar direction, which was found to be 0.15 S/cm. Also, devices with different inter-electrode distances (8 mm, 15 mm, respectively) were prepared similarly as described above in total number of 10, and the average values $\sigma$ of conductivity in the film interplanar direction were determined by carrying out the same measurement as mentioned above. As the result, the values obtained in both cases were within the range from 0.12 to 0.15 S/cm, whereby it was confirmed that electrodes with ohmic contact were formed. Comparative example 1

As an example of the prior art method, a monomolecular built-up film comprising bis-tetracyanoquinodimethane docosylpyridinium having two grooves was obtained on a substrate in the same manner as in Example 4-1 except that the organic thin film at the portion equipped with electrodes was peeled off mechanically without recourse to energy irradiation. Electrodes were formed by coating the grooves with silver paste (inter-electrode distance: 15 mm).

According to the same method as described above, total 10 devices were prepared and a same measurement as in Example 4-1 was practiced for said devices to determine the average value $\sigma$ of conductivity in the film interplanar direction, which exhibited a smaller value by approximately one digit as 0.03 S/cm. This may be estimated to result from insufficient between the electrodes and the film based on the unevenness of the film at the portion equipped with electrodes caused by mechanical peel-off or deterioration of the film characteristic in the vicinity of electrodes caused by the organic solvent during coating of silver paste, etc.

EXAMPLE 4-2

In the same manner as in Example 4-1 except for changing the electrode material to Au, 10 devices of the same shape were prepared. However, the interelectrode distance was made 0.5 mm, and Au electrodes were vapor deposited under vacuum according to the same resistance heating method as in Example 4-1 (vapor deposition speed 1.5 mm/s, film thickness 200 nm).

When $\sigma$ of the 10 devices as prepared above was determined similarly as in Example 4-1, it was found to exhibit a value of 0.19 S/cm better than that of the prior art product.

EXAMPLE 4-3

According to the same method as in Example 4-1, a monomolecular built-up film 26 of bis-tetracyanoquinodimethane was formed in 20 layers on a glass substrate 12.

Figure 16A:
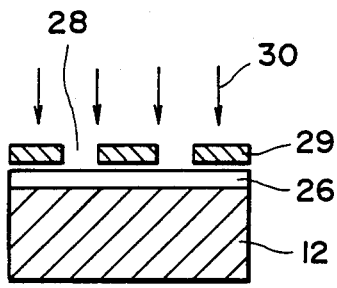
FIGS. 16A through 16C are each diagram for illustration of still another embodiment of the method [d] of the present invention.

A mask 29 made of nickel permalloy having several slits (windows) 28 with widths and intervals of 1 mm was brought into contact with said monomolecular built-up film 26 as shown in FIG. 16A.

Figure 16B:
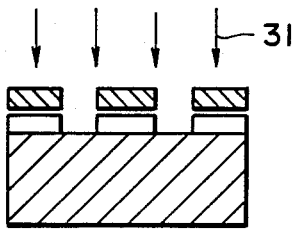

The substrate 12 having said mask 29 contacted thereon was placed in a vacuum vessel of a high frequency excitation ion plating device having a gas introducing inlet and an electron beam vaporization source in combination, and Ar ions were generated by introducing Ar gas (gas pressure $5 \times 10^{-3}$ Torr) through the gas introducing inlet simultaneously with application of a high frequency power (frequency 13 MHz, output 12 W). The Ar ions were accelerated at 100 eV and Ar ion irradiation 30 was effected through the masks 29 onto the monomolecular built-up film 26 for 10 minutes, whereby two grooves as shown in FIG. 16B were formed on said film 26. The substrate temperature was kept at room temperature.

Figure 16C:
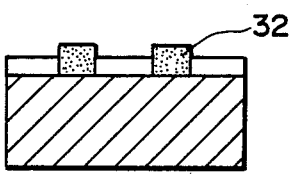

Without taking out the substrate 12 under the state contacted with the mask 29 from the vacuum vessel, said vessel was again evacuated to vacuum (about $2 \times 10^{-6}$ Torr, and this time Al vapor deposition (film thickness 200 nm) 31 was effected as shown in FIG. 16B by use of an electron beam vapor deposition source under the conditions of emission current of 600 mA and acceleration voltage of 10 KV to form a pair of opposed electrode 32 as shown in FIG. 16C.

When current voltage characteristics were measured for total 10 devices prepared according to the same method as described above, in at least the region of 0 to 1 V, linearity was observed to confirm that electrodes with ohmic contact were formed. The average value of conductivity in the film interplanar direction of this device was found to be 0.14 S/cm.

In this Example, the case of filling electrode materials into the peeled portion by electron beam vapor deposition is shown, but at this time filling by ion plating by application of high frequency and acceleration of the ions generated is also possible.

EXAMPLE 4-4

According to the same method as in Example 4-1, monomolecular built-up films of bis-tetracyanoquinodimethane were built up in 20 layers.

Next, the substrate having said monomolecular built-up film formed thereon was enclosed in a vacuum vessel having a window for introduction of light together with several mg of a tungsten complex ($W(CO)_6$). After the gas pressure of $W(CO)_6$ in the vessel reached saturated vapor pressure, a CW (continuous) laser beam with a spot diameter of 3 μm, central wavelength of 257 nm and intensity of 500 W/cm$^2$ was irradiated through the window of said vessel from above the film surface, thereby effecting simultaneously peel-off of the monomolecular built-up film and deposition of tungsten onto the substrate according to the laser excitation reaction method. At this time, by scanning of said laser beam (scanning speed 1 μm/sec) to linear tungsten electrodes (inter-electrode distance 1 mm) were obtained on the substrate. When the current voltage characteristics between the tungsten electrodes of the device obtained as described above were measured, linearity was observed in at least the range of $0-\pm 1$ V to confirm that electrodes with ohmic contact were formed.

In this example, $W(CO)_6$ was used as the starting material for formation of electrodes, but otherwise Fe electrodes of Cr electrodes, etc., can be formed easily by use of, for example, $Fe(CO)_5$, $Cr(CO)_6$, etc.

The method of the present invention is not limited to equipment of electrodes onto the monomolecular built-up film having electroconductivity as shown in the above Examples, but it is also of course applicable for the case, for example, when a peeled portion is formed by energy irradiation on the insulating organic thin film formed on a semiconductor device or a conductor and external connecting electrodes are equipped onto the semiconductor device or conductor therebeneath. Also, in addition to such external connecting electrodes, for example, by practicing repeatedly film formation and formation of peeled portion by energy irradiation as well as filling of electrode materials as exemplified in the above Examples, it is also possible to equipped internal connecting electrodes for connecting the desired portions of the electroconductive layers within the organic thin film.

According to the method of the present invention, an insulating region with any desired pattern can be formed easily and with good precision in the desired region of an electroconductive monomolecular built-up film. In other words, it is a method for forming electroconductive pattern with extremely high degree of freedom, and its usefulness is very great in development of electronic devices and molecular devices in the future. In the present invention, the terminal ends of the conductor are shaped in a form of steps, and electrodes are equipped on the portion shaped in said steps. For this reason, the exposed area of the electroconductive layer at the conductor terminal end portions where electrodes are equipped is increased to increase the contact area between the electrodes and the electroconductive layer where said electrodes are equipped, whereby there occurs no incomplete condition between the respective electroconductive layers separated by insulating layers as in the prior art. Also, by increase of the contact area with electrodes, the contact strength between the electroconductive layer and electrodes is increased to avoid inconvenience such as electrode peel-off, etc. According to the present invention, it is possible to equip electrodes without giving mechanical or chemical damages to conductors, particularly organic electroconductive films, whereby there is provided a novel method for equipment of electrodes capable of contributing to development in the field of electronics, above all in the field of molecular electronics. The present invention has achieved the effects enumerated below:

(1) Electrodes can be formed with high precision, and improved reproducibility;

(2) Degree of freedom for selection of electrode materials and the method for formation thereof is high, whereby improvement of device performance and simplification of the steps can be effected;

(3) Fine working has become possible.

Further, the organic wiring member which is an electroconductive film equipped with electrodes according to the method of [d] of the present invention can be produced at a normal temperature because of unnecessariness of heating the substrate, and it can be used as the organic wiring member for bioelectronics. It is possible also to produce a wiring member with a smaller number of steps as compared with the prior art.

We claim:

1. An organic film comprising an alternate laminate of electroconductive layers and insulating layers provided on a substrate, said film comprising at least one electroconductive region and at least one low or non-electroconductive region in each of said electroconductive layers arranged in superposition and said organic film comprising a molecular film or a molecular film built-up.

2. An organic film according to claim 1, wherein said film is formed according to the LB method.

3. An organic film according to claim 1, wherein said low- or non-electroconductive region is formed by exposure to an energy beam.

4. An organic film according to claim 3, wherein said energy beam is one of light, heat and flux of particles.

5. An organic film according to claim 4, wherein said heat is generated by irradiation of a laser beam or a UV-ray.

6. An organic film according to claim 4, wherein said flux of particles is anion beam or an electron beam.

7. An organic film according to claim 1, wherein said low or non-electroconductive region is formed in such a manner that peeling off of said layer does not occur.

8. An organic film according to claim 1, wherein said electroconductive region in said electroconductive layer is insoluble in a solvent.

9. An organic film according to claim 8, wherein said electroconductive region is formed by polymerizing a compound having a double bond.

10. An organic film according to claim 8, wherein said energy beam is an electron beam or a UV-ray.

11. A patterning method, comprising the steps of laminating an electroconductive layer and an insulating layer in the form of a molecular film or monomolecular built-up film on a substrate and forming a low- or non-electroconductive region in the electroconductive layer by exposing same to energy beam irradiation.

12. A patterning method according to claim 11, wherein said energy beam is light, heat or flux of particles.

13. A patterning method according to claim 12, wherein said heat is generated by irradiation of a laser beam or a UV-ray.

14. A patterning method according to claim 12, wherein said flux of particles is an ion beam of an electron beam.

15. A patterning method comprising the steps of laminating an electroconductive layer and an insulating layer in the form of a monomolecular film or a molecular built-up film composed of a compound having a polymerizable double bond on a substrate and forming a region having changed solubility in a solvent by projecting an energy beam to the electroconductive layer in the direction perpendicular to the layer direction to cause polymerization of said compound.

16. A patterning method according to claim 15, wherein said energy beam is an electron beam or a Uv-ray.

17. An organic film according to claim 9, wherein said compound having a double bond is a tetracyanoquinodimethane complex represented by any one of the following formulae No. 1 to No. 3:

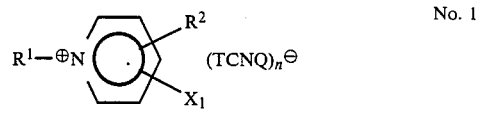

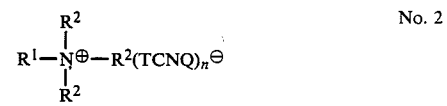

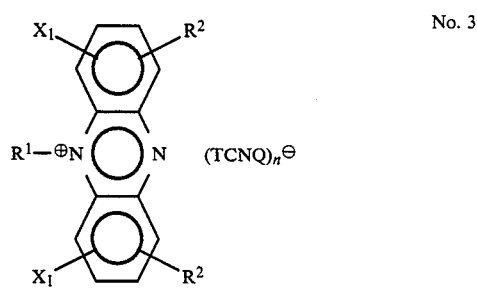

wherein $R^1$ represents a long chain alkyl or alkenyl group, $R^2$ represents hydrogen or a short chain alkyl or alkenyl group, at least one of $R^1$ and $R^2$ is an alkenyl group, TCNQ represents tetracyanoquinodimethane or a derivative thereof, $X_1$ represents hydrogen, a halogen atom, cyano group or alkoxy group, and n represents 1 or 2.

18. An organic film according to claim 8, wherein said film is formed according to the LB method.

19. An organic film according to claim 8, wherein said electroconductive region is formed by exposure to an energy beam.

* * * * *

UNITED STATES PATENT AND TRADEMARK OFFICE
CERTIFICATE OF CORRECTION

PATENT NO. : 4,835,083

DATED : May 30, 1989

INVENTOR(S) : KUNIHIRO SAKAI, ET AL.

Page 1 of 2

It is certified that error appears in the above-identified patent and that said Letters Patent is hereby corrected as shown below:

COLUMN 1

Line 9, "manipulations" should read --manipulation--.
Line 14, "manipulation" should read --manipulating--.
Line 42, "on" should be deleted and "surface" should read --surface.--.
Line 64, "film" should read --film.--.

COLUMN 2

Line 15, "the $10^{-14}$ S/cm" should read --the film surface, but to have an electroconductivity of $10^{-14}$ S/cm--.
Line 19, "molecules" should read --molecules,--.
Line 29, "is," should read --is--.
Line 66, "known. For" should read --known, for--.
Line 67, "known elec-" should read --known in which elec- --.

COLUMN 4

Line 10, "electrode" should read --electrodes--.
Line 57, "provide" should read --to provide--.

COLUMN 8

Line 53, "not" should be deleted.

COLUMN 16

Line 17, "KHCOhd 3." should read --$KHCO_3$.--.
Line 54, "accompaniement" should read --accompaniment--.

UNITED STATES PATENT AND TRADEMARK OFFICE
CERTIFICATE OF CORRECTION

PATENT NO. : 4,835,083
DATED : May 30, 1989
INVENTOR(S) : KUNIHIRO SAKAI, ET AL.

Page 2 of 2

It is certified that error appears in the above-identified patent and that said Letters Patent is hereby corrected as shown below:

COLUMN 17

Line 31, "Further" should read --Further,--.

COLUMN 21

Line 47, "KHCOhd 3." should read --$KHCO_3$.--.

COLUMN 25

Lines 3-4, "film built-up." should read
        --built-up film.--.
    Line 16, "anion" should read --an ion--.
    Line 26, "claim 8," should read --claim 19,--.
    Line 41, "of" (second occurrence) should read --or--.

COLUMN 26

Line 7, "Uv-ray." should read --UV-ray.--.

Signed and Sealed this

Fifteenth Day of May, 1990

Attest:

HARRY F. MANBECK, JR.

*Attesting Officer*        *Commissioner of Patents and Trademarks*